(12) United States Patent  (10) Patent No.: US 8,589,841 B2
Arbel et al.  (45) Date of Patent: Nov. 19, 2013

(54) AUTOMATIC PARITY CHECKING IDENTIFICATION

(75) Inventors: Eli Arbel, Nesher (IL); Sergey Novimov, Tel Aviv (IL); Karen Yorav, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/439,885

(22) Filed: Apr. 5, 2012

(65) Prior Publication Data

US 2013/0268906 A1    Oct. 10, 2013

(51) Int. Cl.
G06F 17/50    (2006.01)
G06F 11/00    (2006.01)
H03M 13/00    (2006.01)

(52) U.S. Cl.
USPC ........... 716/107; 716/104; 716/105; 716/106; 714/42; 714/43; 714/48; 714/752; 714/758

(58) Field of Classification Search
USPC ........ 716/104, 105, 106, 107; 714/42, 43, 48, 714/752, 758
See application file for complete search history.

(56) References Cited

U.S. PATENT DOCUMENTS

| | | | | |
|---|---|---|---|---|
| 3,991,278 A * | 11/1976 | Fang et al. | ..................... | 370/227 |
| 4,215,420 A * | 7/1980 | Kassakian | ..................... | 703/4 |
| 4,370,708 A * | 1/1983 | Bruce et al. | ..................... | 703/25 |
| 4,488,259 A * | 12/1984 | Mercy | ..................... | 714/726 |
| 4,561,095 A * | 12/1985 | Khan | ..................... | 714/767 |
| 4,705,477 A * | 11/1987 | Komorowski et al. | ..................... | 434/24 |
| 4,727,548 A * | 2/1988 | Dickey | ..................... | 714/803 |
| 4,819,150 A * | 4/1989 | Jennings et al. | ..................... | 703/21 |
| 4,853,930 A * | 8/1989 | Shimada | ..................... | 714/789 |
| 4,884,273 A * | 11/1989 | Caprasse | ..................... | 714/803 |
| 4,975,869 A * | 12/1990 | Ammann et al. | ..................... | 714/28 |
| 5,146,563 A * | 9/1992 | Donaldson et al. | ..................... | 326/82 |
| 5,388,215 A * | 2/1995 | Baker et al. | ..................... | 709/229 |
| 5,625,580 A * | 4/1997 | Read et al. | ..................... | 703/21 |
| 5,673,419 A * | 9/1997 | Nisar | ..................... | 703/28 |
| 5,825,204 A * | 10/1998 | Hashimoto | ..................... | 326/54 |
| 5,898,878 A * | 4/1999 | Densham et al. | ..................... | 710/260 |
| 6,150,841 A * | 11/2000 | Agrawal et al. | ..................... | 326/41 |
| 6,590,929 B1 * | 7/2003 | Williams | ..................... | 375/224 |
| 6,606,589 B1 * | 8/2003 | Tuma et al. | ..................... | 703/24 |
| 6,992,506 B2 * | 1/2006 | Park et al. | ..................... | 326/52 |
| 7,096,440 B2 | 8/2006 | Fechser | | |
| 7,308,397 B2 * | 12/2007 | Jibbe et al. | ..................... | 703/24 |
| 7,441,209 B2 * | 10/2008 | Roesner et al. | ..................... | 716/103 |
| 7,568,130 B2 * | 7/2009 | Smith et al. | ..................... | 714/42 |
| 7,571,403 B2 * | 8/2009 | Jain et al. | ..................... | 716/106 |
| 7,620,854 B2 * | 11/2009 | Kuttan et al. | ..................... | 714/43 |

(Continued)

FOREIGN PATENT DOCUMENTS

CN    102054100 A    5/2011

*Primary Examiner* — Helen Rossoshek
(74) *Attorney, Agent, or Firm* — Ziv Glazberg

(57) ABSTRACT

A method, apparatus and computer program product for automatic parity check identification. The method comprising: automatically identifying a parity signal in a circuit design, wherein the parity signal is defined as a parity function of a set of support signals, wherein the automatic identification comprises: obtaining a candidate parity signal and a corresponding set of candidate support signals; and verifying that a bit flip in exactly one of any of the corresponding candidate set of support signals induces a bit flip on a value of the candidate parity signal; wherein said method further comprises reporting the automatically identified parity signal.

20 Claims, 4 Drawing Sheets

(56) References Cited

U.S. PATENT DOCUMENTS

| | | | |
|---|---|---|---|
| 7,747,933 B2* | 6/2010 | Johnson | 714/799 |
| 7,917,874 B2* | 3/2011 | Baumgartner et al. | 716/105 |
| 7,924,845 B2* | 4/2011 | Diehl et al. | 370/395.4 |
| 7,962,829 B2* | 6/2011 | Atsumi | 714/758 |
| 8,015,468 B2* | 9/2011 | Krouk et al. | 714/752 |
| 8,300,748 B2* | 10/2012 | Carson | 375/354 |
| 2006/0220716 A1* | 10/2006 | Nicolaidis | 327/199 |
| 2007/0028203 A1* | 2/2007 | Sato et al. | 716/18 |
| 2011/0107178 A1* | 5/2011 | Nakamura et al. | 714/758 |

* cited by examiner

US 8,589,841 B2

AUTOMATIC PARITY CHECKING IDENTIFICATION

TECHNICAL FIELD

The present disclosure relates circuit design in general, and to analysis of circuit designs, in particular.

BACKGROUND

With the shrinking sizes of hardware devices, design susceptibility to soft errors became a significant concern in electrical designs. Most modern designs, from ASICs to microprocessors, contain some degree of Error Detection and/or Correction (EDC) capabilities, often implemented as additional logic. In some cases, a design may adhere to very strict reliability requirements and may be designed with an extensive amount of EDC in it such that almost all functional latches may be protected against soft (or hard) errors using hardware error checkers.

Different methodologies and techniques are used in order to verify that a given design meets its reliability requirements. One of these methods is code reviews, which occurs during the logic implementation phase. The goal of the review process is to make sure that latches in the design are protected according to the corresponding specification. For example, if a command bus is specified to be protected by parity checking, the design reviewer will have to make sure that is what was actually implemented in the hardware description (e.g., VHDL files). As this process involves going thru many lines of code in many files, it is very time-consuming and error-prone.

BRIEF SUMMARY

One exemplary embodiment of the disclosed subject matter is a computer-implemented method performed by a computerized device comprising a processor, the method comprising: automatically identifying a parity signal in a circuit design, wherein the parity signal is defined as a parity function of a set of support signals, wherein the automatic identification comprises: obtaining a candidate parity signal and a corresponding set of candidate support signals; and verifying that a bit flip in exactly one of any of the corresponding candidate set of support signals induces a bit flip on a value of the candidate parity signal; wherein said method further comprises reporting the automatically identified parity signal.

Another exemplary embodiment of the disclosed subject matter is a computerized apparatus having a processor, the processor being adapted to perform the steps of: automatically identifying a parity signal in a circuit design, wherein the parity signal is defined as a parity function of a set of support signals, wherein the automatic identification comprises: obtaining a candidate parity signal and a corresponding set of candidate support signals; and verifying that a bit flip in exactly one of any of the corresponding candidate set of support signals induces a bit flip on a value of the candidate parity signal; wherein said processor further adapted to report the automatically identified parity signal.

Yet another exemplary embodiment of the disclosed subject matter is a computer program product comprising: a non-transitory computer readable medium retaining program instructions, which instructions when read by a processor, cause the processor to performs the steps of: automatically identifying a parity signal in a circuit design, wherein the parity signal is defined as a parity function of a set of support signals, wherein the automatic identification comprises: obtaining a candidate parity signal and a corresponding set of candidate support signals; and verifying that a bit flip in exactly one of any of the corresponding candidate set of support signals induces a bit flip on a value of the candidate parity signal; wherein said program instruction, when read by the processor, further cause the processor to report the automatically identified parity signal.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1A:
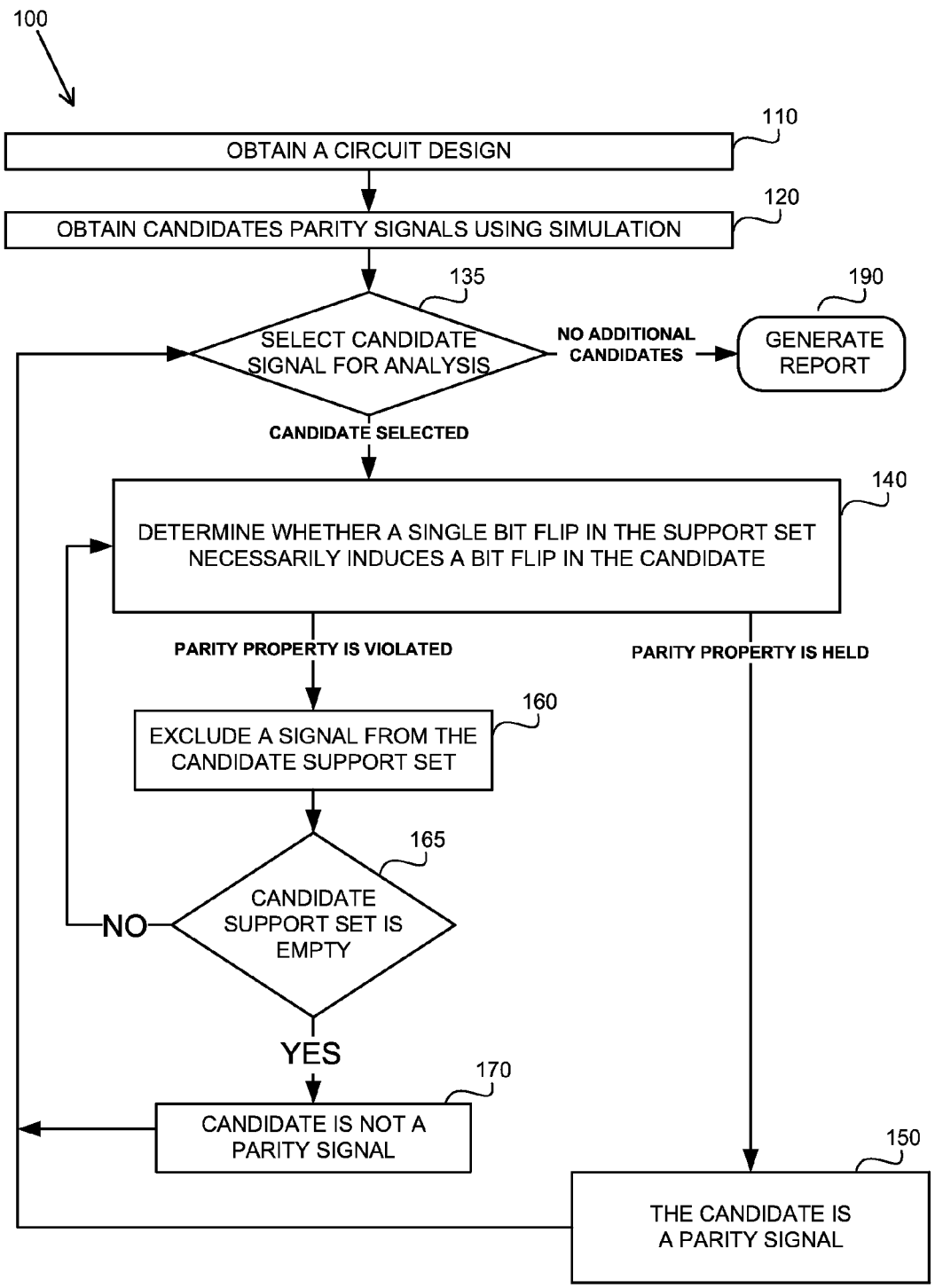
FIG. 1A shows a flowchart diagram of a method, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A "latch" in the present disclosure is a generic term relating to any form of state storage device, including but not limited to a latch, a flip-flop, or the like.

A "design", a "circuit" or a "circuit design", as used herein, is a functional definition of an electronic circuit. A design may be provided using any Hardware Descriptive Language (HDL) including but not limited to VHDL, Verilog, SystemC, EDL, RTL, PSL or the like. In some exemplary embodiments, the design may correspond to an Integrated Circuit (IC) or a different hardware product.

One technical problem dealt with by the disclosed subject matter is to automatically analyze a circuit design to extract information relating to its operation. In some exemplary embodiments, the problem may be to identify parity signals. Additionally or alternatively, parity signals which are used as part of EDC constructs may be identified.

In some exemplary embodiments, such analysis may aid in the review process by automatically identifying hardware EDC mechanisms, and by generating EDC-related information such that the design reviewer can achieve the same review goals without the need to manually review the entire circuit design, which may be defined in a variety of files.

In some exemplary embodiments, such analysis may be used for gaining insight into vendor designs, such as identifying EDC mechanisms implemented in them and analyzing such mechanisms. It will be noted that in many cases, a circuit designing business entity may use third party designs as part of its circuit design. For such business entity being able to quantify reliability characteristics of third party designs may be crucial for the reliability sign-off process. System level error rate estimation such error injection in simulation can help with this problem, but many times it occurs too late in the design cycle or does not occur at all. Thus the only way to estimate third party logic reliability is to analyze the circuit design. Considering the fact that third party circuit designs may be supplied in the form of gate-level netlist, or in another non-human readable format, having a tool capable of extracting reliability properties automatically from such representation may be important.

Another technical problem dealt with by the disclosed subject matter is the automatic identification of certain types of error checking mechanism, particularly ones which are based on parity checking. This type of checking is widely used in many designs for protecting both control logic as well as data path designs.

One technical solution provided by the disclosed subject matter is to obtain a candidate parity signal and an initial set of candidate support signals. Based on the given candidates, the existence of a property of a parity function may be verified with respect to the parity signal. The property may be that the value of the parity signal is flipped in case one of the support signals' value is flipped.

In some exemplary embodiments, the existence of the property may be verified using formal methods such as using a Boolean Satisfiability Problem (SAT) solver, a Binary Decision Diagram (BDD), or the like. In some exemplary embodiments, a CNF that is designed to be satisfiable if and only if the parity property is violated may be constructed, and a SAT solver may be utilized to determine whether the property is held. In case of a violation and based on a satisfying assignment to the CNF, the set of candidate support signals may be reduced and the new candidate support set may be checked instead. This process may be performed iteratively and with respect to different candidate parity signals and their corresponding candidate sets of support signals.

In some exemplary embodiments, the candidate parity signals may be identified based on simulated executions of the circuit design. In some exemplary embodiments, simulated states of the design may be determined using a simulator, such as an HDL simulator. An effect of bit-flipping a single signal may be computed and based thereof, candidate signals may be identified. The use of simulation may have a technical effect of reducing the potential number of candidates substantially with respect to a naïve initial candidate identification (e.g., each signal may be a candidate and each signal that has the potential to effect its value is in a corresponding candidate support set).

Another technical solution is to determine one or more latches which are being protected by the parity checker. Algorithmic analysis can yield actual latch names which are protected by the parity checker. In some exemplary embodiments, a topological analysis of the circuit design with respect to the parity support signals may be performed. Additionally or alternatively, common parity protection structures are looked for in the circuit design. As an example for common parity protection structure consider a Finite State Machine (FSM) parity protection where parity is being calculated for the FSM latch inputs and then compared to the FSM latch output parity.

Yet another technical solution is to utilize the automatic circuit design analysis in verifying the circuit design. The verification may be, for example, by manual logic review of the circuit design and in particular its EDC constructs; formal verification of the functionality of the EDC constructs; automatic comparative verification verifying that the circuit design adheres to requirements of a corresponding specification (requirements which may be provided, for example, using smart comments or any other computer-readable language).

Referring now to FIG. 1A showing a flowchart of a Method 100, in accordance with some exemplary embodiments of the disclosed subject matter.

In Step 110, a circuit design is obtained. The circuit design may be obtained in a source code form, such as VHDL code, or in a binary form, such as netlists. In some exemplary embodiments, the circuit design may be obtained in a non-human readable form or in a form that is not convenient for a human to read.

In Step 120, candidates that may function as parity signals may be obtained. In some exemplary embodiments, with respect to each candidate parity signal, a suspected set of support signals thereof may be obtained. In some exemplary embodiments, the candidates may be obtained based on one or more simulated executions of the circuit design. Alternatively, each signal of the design may be considered as a candidate, and each signal which may be used to compute the value thereof may be considered as part of the candidate set of support signals.

In some exemplary embodiments, the candidate signals and candidate support sets of Step 120 are over-approximations, which may be tightened (e.g., by removing signals from the candidate support sets) in order to determine the parity signals and their true corresponding support sets.

In Step 135, a candidate parity signal is selected for analysis. Steps 135-170 may be performed iteratively until all candidate signals have been analyzed. In response to a determination that all candidates have been analyzed, Step 190 may be performed and an output of the analysis may be provided and utilized. In some exemplary embodiments, the output may be provided in a form of a generated report that is human-readable.

In Step 140, it may be verified that the parity property is held by the candidate signal and the candidate support set. In some exemplary embodiments, the parity property is held if and only if in response to flipping a value of exactly one of the support set signals, the value of the candidate is consequently flipped. In some exemplary embodiments, the parity property is verified using a SAT solver, a BDD, or a similar formal method. In some exemplary embodiments, an auxiliary design may be constructed, and based thereof a constructing a Conjunctive Normal Form formula (CNF) may be constructed. Using a SAT Solver it may be determined that the CNF is satisfiable or unsatisfiable. In some exemplary embodiments, the CNF may be constructed directly and without the pre-construction of the auxiliary design. In the present disclosure, for the sake of clarity, the CNF is referred to as an auxiliary design, and is depicted using the elements of the auxiliary design.

Figure 4:
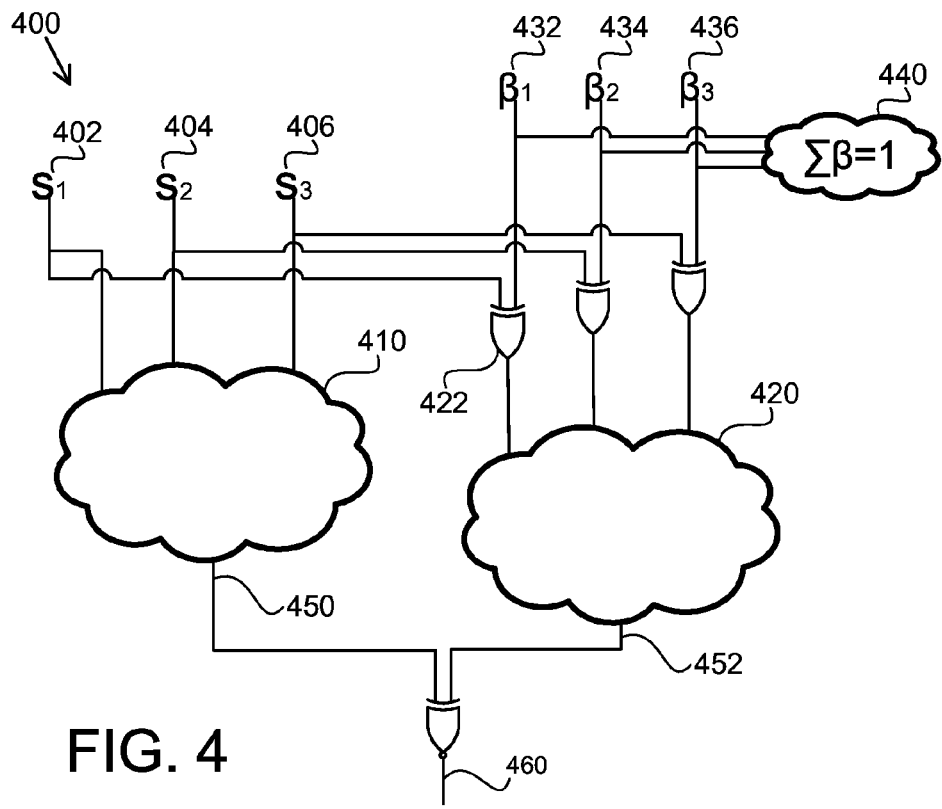
FIG. 4 shows an illustration of a design useful in verifying that a parity property is held by a candidate signal, in accordance with some exemplary embodiments of the disclosed subject matter.

In some exemplary embodiments, a CNF, such as depicted in FIG. 4, where the output signal is compared to a ONE value, may be constructed, and the SAT Solver may be utilized to determine whether or not there is a situation in which the candidate parity signal's value is not flipped in response to a flipping of a single signal out of the candidate set of support signals.

In case the parity property is held, the candidate is determined (150) to be a parity signal, which checks the values of a support set. The parity signal may be utilized by a parity checker.

In case the parity property is violated, the determination of Step 140 may provide a counter-example in which a value of a signal of the candidate support set is flipped but the value of the candidate parity signal is not flipped. Based on such counter-example, the signal may be excluded from the candidate support set (160). If the candidate support set is not empty (165), step 140 may be performed once more with respect to the updated candidate support set. Otherwise, the candidate parity is determined to be a non parity signal (170).

In some exemplary embodiments, Step 165 may check whether there are at least two signals in the candidate support set, as a parity signal with respect to one signal may not be useful for EDC and other purposes, in accordance with the disclosed subject matter.

Figure 1B:
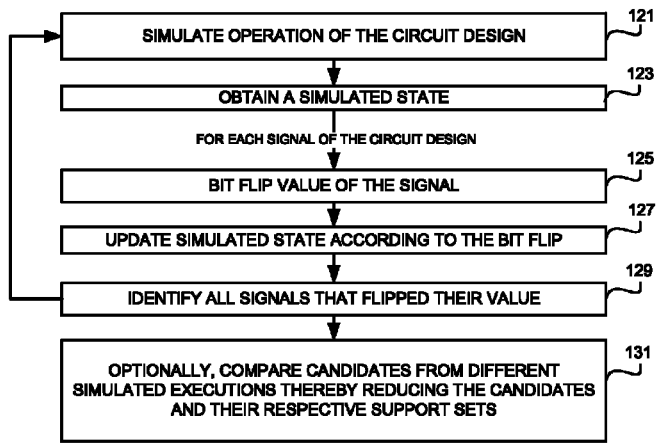
FIG. 1B shows a flowchart diagram of a method, in accordance with some exemplary embodiments of the disclosed subject matter.

Referring now to FIG. 1B showing a flowchart of a method, in accordance with some exemplary embodiments of the disclosed subject matter. In some exemplary embodiments, the steps of FIG. 1B may be performed as part of Step 120 in Method 100.

In Step 121, the operation of the circuit design may be simulated. The simulation may be performed using an HDL simulator, or the like.

In Step 123, a simulated state may be obtained. The simulated state may define a value for each signal of the circuit design.

In Steps 125-129 it may be determined which signals are affected by a bit flip of each signal of the circuit design. Based on such determinations, candidate parity signals and corresponding candidate support sets may be determined.

Steps 125-129 may be performed with respect to each signal of the circuit design. In each such iteration (not shown), a different signal is selected and analyzed. The value of the selected signal is flipped (125), the simulated state may be updated accordingly (127), and all signals whose value has changed are identified (129). Each signal that has changed may be considered as a candidate parity signal and the selected signal may be added to its corresponding candidate support set.

Consider the following example: flipping the value of signal X1 may cause signals P1 and P2 to flip their value. In addition, flipping the value of signal X2 may cause signal P1 to flip its value, whereas flipping either signals X3 or X4 causes signal P2 to flip its value. Based on this example, signal P1 may be considered as a candidate parity signal whose candidate support set is {X1,X2} and signal P2 may be considered as a candidate parity signal whose candidate support set is {X1, X3, X4}.

In some exemplary embodiments, a plurality of simulations may be performed (Steps 121-129). In some examples, the most reduced candidate sets may be selected. In some exemplary embodiments, based on the different simulated executions, the candidates may be determined (131). Additionally or alternatively, for each candidate in each simulated execution, the candidate support sets may be conjuncted together to determine the candidate support set. For example, consider again the example above and assume that in a different simulation the candidate support set for P1 is {X3, X4, X5} and the candidate support set for P2 is {X1, X3, X5, X8}. Based on these two simulation it may be determined that P1 has an empty support set ({X1,X2}∩{X3, X4, X4}) and therefore is not a candidate, whereas the support set of P2 is {X1, X3}.

Figure 2:
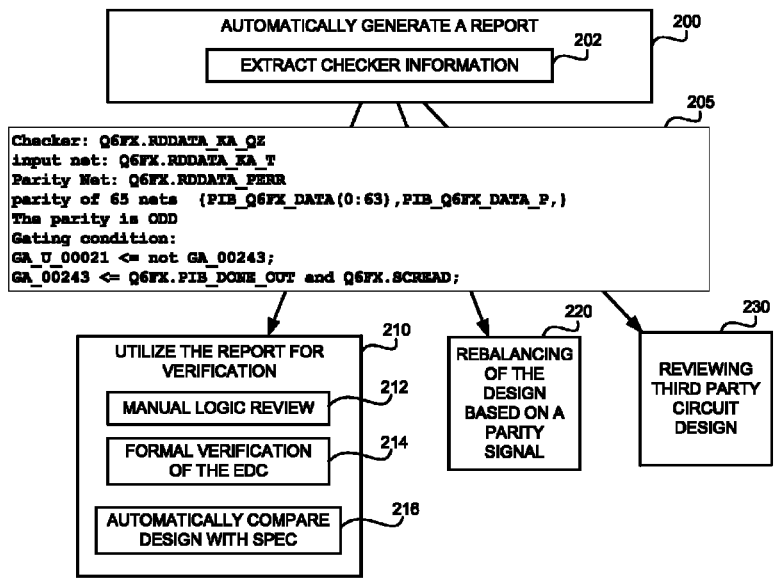
FIG. 2 shows a flowchart diagram of a method, in accordance with some exemplary embodiments of the disclosed subject matter.

Referring now to FIG. 2 showing a method in accordance with some exemplary embodiments of the disclosed subject matter.

In Step 200, a report may be generated automatically. The report may be an output of a method such as Method 100. In some exemplary embodiments, the report may indicate parity checkers and their corresponding parity signals and support sets. In some exemplary embodiments, the report may comprise additional checker information.

In Step 202, the checker information may be extracted. In some exemplary embodiments, the checker information may include signal name of the checker, names of latches which are protected by the checker, gating conditions, type of parity checking, or the like.

In some exemplary embodiments, elements of the checker in the circuit design, such as latches of the checker, may be identified. The identification may be performed either manually (and provided as input by a user), semi-automatically or automatically. In some exemplary embodiments, automatic determination may be performed based on naming conventions or using other alternative methods.

Determining Protected Latches:

Structural static analysis of the circuit design can yield names of latches which are protected by the parity checker. In some exemplary embodiments, the analysis may be performing topological analysis of the circuit with respect to the parity support signals, where common parity protection structures are looked for in the circuit. For example, FSM parity protection where parity is being calculated for the FSM latch inputs and then compared to the FSM latch output parity.

Extracting Gating Conditions:

In some exemplary embodiments, error checking is enabled only in certain states, e.g. when the data held in the checked latches is valid. The gating condition, such as the gating function or the enabling function, may determine in which cycles of the circuit design the checker is enabled. Given a parity signal P and an error checker whose input signal is E, an enabling function G is defined as follows: G=dE/dP (i.e., Boolean difference of E with respect to P). The enabling function may be computed automatically based on the circuit design. In one exemplary embodiment, the enabling function may be computed using a BDD.

Type of Parity Checking:

To check whether an error checker polarity is even or odd, the design may be checked for the following $(G=1) \rightarrow (E \Leftrightarrow P)$, where G is the gating function, E is the function of the error checker, and P is a parity function with specific polarity defined over the checked signals.

A Generated Report 205 may be provided in a human readable form. Generated Report 205 may include a list of sections, each of which contains different information, such as for example, checker name and error input signal name, name of the parity signal itself, checked signals, checker polarity (odd/even), gating condition, or the like. In some exemplary embodiment, the report may be in a non-human readable form and may be utilized by automated processes.

The Generated Report 205 may be utilized in different manners. In Step 210, the report may be utilized for verification, whereas in Step 220 the report may be utilized to modify the design, such as such as by performing Xor-tree rebalancing based on the identified parity signal. Additionally or alternatively, in Step 230, the report may be used for assisting the review of third party circuit designs, such as competitor's designs, off-the-shelf designs which are used as imported components of a circuit design, or the like.

In some exemplary embodiments, Step 210 may comprise any of the Steps 212-216.

In Step 212, logic review of the circuit design may be performed manually. The report may assists logic designers during their logic reviews, particularly during RAS (Reliability, Availability, Serviceability) reviews. The report may provide concise and accurate information regarding existing RAS structures in the circuit design. As the reported may be automatically generated, designers may be relieved from doing detailed implementation level reviews of the automatically identified portions of the design. In some exemplary embodiments, the disclosed subject matter, therefore, may save designer time required for analyzing complex logic structures, as the designer may only be required to understand high-level properties.

Additionally, the report may ensure that all RAS structures are reviewed, regardless of how and where they are defined in the implementation (e.g., in which VHDL files). A distributed implementation of an RAS structure or an implementation that is defined in a negligible and/or remote portion of the design may be missed or overlooked during a manual review effort.

Furthermore, the automatically generated report may eliminate the risk of misinterpreting RAS properties during the manual review, as these may be proved formally by an automated process and provided as a readable report.

In Step 214, the EDC construct may be formally verified. As the report defines which EDC constructs exists as well as their respective properties, it may be formally verified whether or not the EDC constructs perform their designated functionality. Formal verification may be performed using a model checker, such as a SAT-based model checker, a BDD-based model checker, an explicit model checker, or the like.

In step 216, the circuit design may be compared with a specification thereof to check that each EDC construct in the specification is implemented correctly to protect the correct signals in the circuit design, such as output signals of specific latches. In some exemplary embodiments, such comparison may be performed automatically, such as based on a computer-readable specification. In one example, the specification may be annotated using smart comments which may provide a computer-readable specification. However, other forms of computer-readable specifications may be utilized instead.

Figure 3:
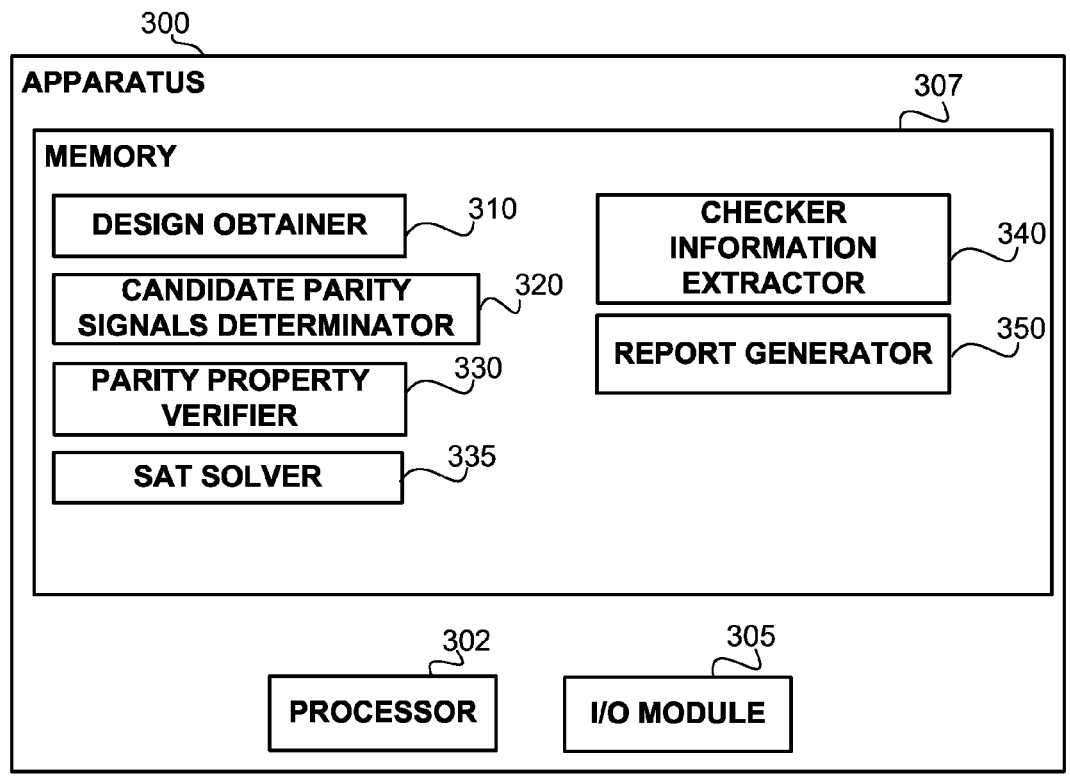
FIG. 3 shows a block diagram of an apparatus, in accordance with some exemplary embodiments of the disclosed subject matter.

Referring now to FIG. 3 showing an apparatus in accordance with some exemplary embodiments of the disclosed subject matter. An apparatus 300 may be configured to perform any of the methods depicted in FIGS. 1-2 or portions thereof.

In some exemplary embodiments, Apparatus 300 may comprise a Processor 302. Processor 302 may be a Central Processing Unit (CPU), a microprocessor, an electronic circuit, an Integrated Circuit (IC) or the like. Processor 302 may be utilized to perform computations required by Apparatus 300 or any of it subcomponents.

In some exemplary embodiments of the disclosed subject matter, Apparatus 300 may comprise an Input/Output (I/O) Module 305. I/O Module 305 may be utilized to provide an output to and receive input from a user, such a verification engineer, a QA staff member, a circuit designer, a logic reviewer, or the like. I/O Module 305 may be utilized to provide a generated report in a human readable form, such as 205 of FIG. 2, to a user.

In some exemplary embodiments, Apparatus 300 may comprise a Storage Device 207. Storage Device 307 may be a hard disk drive, a Flash disk, a Random Access Memory (RAM), a memory chip, a combination thereof, or the like. In some exemplary embodiments, Storage Device 307 may retain program code operative to cause Processor 302 to perform acts associated with any of the subcomponents of the Apparatus 300. In some exemplary embodiments, Storage Device 307 may retain simulated states of a design circuit, netlist representation of the design circuit, pairs of candidate parity signals and their respective candidate support sets, pairs of identified parity signals and their respective support sets, or the like.

In some exemplary embodiments, a Design Obtainer 310 may be operative to obtain a circuit design, such as performed in Step 110 of FIG. 1.

In some exemplary embodiments, a Candidate Parity Signals Determinator 320 may be operative to determine one or more pairs comprising a candidate parity signal and its corresponding candidate support set, such as performed in Step 120 of FIG. 1. Candidate Parity Signals Determinator 320 may be operative to determine the candidates based on structural static analysis of the signals in the circuit design. Additionally or alternatively, Candidate Parity Signals Determinator 320 may obtain the candidates from an external source, such as a user, or an external tool. Additionally or alternatively, Candidate Parity Signals Determinator 320 may determine the candidates based on a simulated execution of the circuit design, such as depicted in the method of FIG. 2.

In some exemplary embodiments, a Parity Property Verifier 330 may be operative to verify whether the parity property is held by the candidate parity signal with respect to the candidate support set, such as performed in Step 140 of FIG. 1. In some cases, Parity Property Verifier 330 may be configured to utilize a SAT solver 335 to verify that the property is held based on a constraint on a value of an output of an auxiliary design. Parity Property Verifier 330. Apparatus 300 may be configured to exclude a signal from the candidate support sets based on a determination that there exists at least one situation in which a single bit flip in the circuit design which occurs in the value of the signal does not induce a bit flip in the value of the candidate parity signal.

It will be understood that SAT Solver 335 may be a standalone tool, an external tool to Apparatus 300, an off-the-shelf tool, or the like.

In some exemplary embodiments, a Checker Information Extraction 340 may be operative to extract information regarding a parity based checker, in accordance with the disclosed subject matter. Checker Information Extraction 340 may perform Step 202 of FIG. 2.

In some exemplary embodiments, Report Generator 350 may be operative to generate a report regarding the parity signals and/or parity checkers identified in the circuit design. In some exemplary embodiments, Report Generator 350 may generate a human-readable report. In some exemplary embodiments, Report Generator 350 may be operative to perform Step 200 of FIG. 2 and optionally generate a report such as Report 205 of FIG. 2.

Referring now to FIG. 4 showing an illustration of a design useful in verifying that a parity property is held by a candidate signal, in accordance with some exemplary embodiments of the disclosed subject matter. An Auxiliary Design 400 may be constructed in accordance with the disclosed subject matter. It will be understood the Auxiliary Design 400 need not be actually fabricated but be utilized in verifying that the parity property is held by a candidate parity signal with respect to a candidate set of support signals. It will be further noted that Auxiliary Design 400 is depicted with a set of three candidate support signals, however, the extension of the underlying concept to any number of candidate support signals is straight forward in view of the disclosed subject matter.

Combinatorial Logic 410 constitutes the fan in logic cone of Candidate Parity Signal 450 in the circuit design. The signals providing input to Combinatorial Logic 410 are the lowest level support set out of the candidate support set, and in FIG. 4 comprise a set of three signals: $S_1$ 402, $S_2$ 404, $S_3$ 406. The lowest level support of group G of signals is defined as all the signals in G which are not driven by other signals in G.

Auxiliary Design 400 further comprises a Replicated Combinatorial Logic 420 which is a replication of the Combinatorial Logic 410. The input to Replicated Combinatorial Logic 420 is the values of the lowest level support signals, which are potentially flipped using a flipping logic. For each lowest level support signal an auxiliary signal, noted as Beta, is added (432, 434, 436) to the Auxiliary Design 400. The value of the signal $S_i$ is either flipped or not flipped using a flipping logic which is operative to be enabled based on the value of $\beta_i$. As one example, flipping logic may be a XOR gate 422 which is connected to both $S_1$ 402 and $\beta_1$ 432. Should the value of $\beta_1$ be ONE, the value of the XOR gate 422 is a flipped value of $S_1$. However, it will be understood that the disclosed subject matter is not limited to an implementation of the flipping logic using a XOR gate and other flipping logics may be utilized instead.

A Cardinality Constraint 440 may be operative to constraint the values of the auxiliary signals 432-436 such that only one of them will have the value of ONE. Therefore, a value of exactly one signal of the lowest level support signals 402-406 is flipped in the Replicated Combinatorial Logic 420.

In some exemplary embodiments, the values of the candidate parity signals (450, 452) in both combinatorial logics 410, 420 are compared and an Output Signal 460 is operative to indicate whether or not they are the same. Using a XNOR gate, Output Signal 460 is ONE only in case both signals 450-452 have the same value.

In some exemplary embodiments, based on Auxiliary Design 460, a CNF requiring that Output Signal 460 is ONE, may be determined and provided to a SAT Solver. The SAT Solver may choose any value to any of the inputs (402-406, 432-436) such that the cardinality constraint 440 is held and in order to cause the Output Signal 460 to be ONE. In case such an assignment is determined by the SAT Solver, it can be determined that the parity property is not held by the candidate parity signal with respect to the candidate support set. Based on such assignment, a support signal which violated the parity property may be excluded from the candidate support set. In case it is determined that the CNF is unsatisfiable, such a determination is a proof that the parity property is held.

Figure 5:
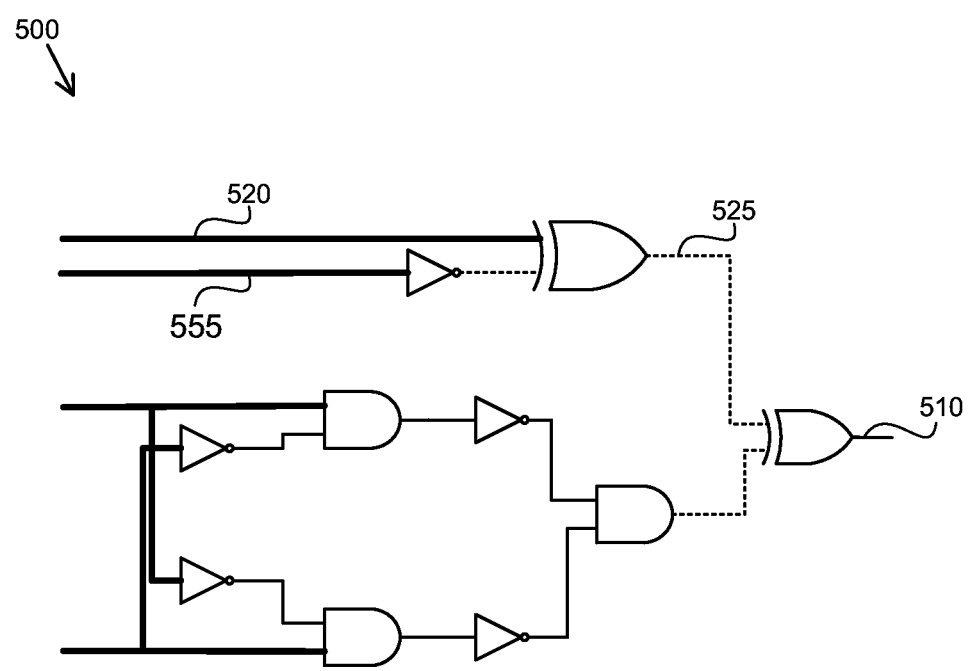
FIG. 5 shows an illustration of a portion of a circuit design, in accordance with some exemplary embodiments of the disclosed subject matter.

Referring now to FIG. 5 showing an illustration of a portion of a circuit design, in accordance with some exemplary embodiments of the disclosed subject matter. FIG. 5 exemplifies the concept of lowest level support signals.

A Design 500 (which may be a portion of the design being analyzed) comprises a Candidate Parity Signal 510. According to a simulation flipping a value of each signal depicted as a bold line or as a dashed line in the design causes a bit flip in the Candidate Parity Signal 510. However, some of the signals in the candidate support set derive their value from other signals in the candidate support set. As an example, consider Signal 525 whose value is derived based on Signal 520. Therefore, Signal 525 is not considered a lowest level support signal whereas Signal 520 is considered a lowest level support signal.

It will be further noted that if during the analysis of the circuit design, it is determined that Signal 520 violates the parity property (and a similar determination is made with respect to Signal 555), Signal 525 may be considered as a lowest level support signal.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method performed by a computerized device comprising a processor, the method comprising:
    analyzing a circuit design to find a parity signal out of a plurality of signals defined by the circuit design, wherein a value of the parity signal is defined as a parity function based on values of a set of support signals, wherein finding the parity signal comprises:
        obtaining a candidate parity signal and a corresponding set of candidate support signals; and
        verifying that the circuit design is configured to induce a bit flip on a value of the candidate parity signal in response to a bit flip in any single signal that is comprised by a subset of the set of candidate support signals, whereby the candidate signal is verified to be a parity signal with respect to the subset of the set of support signals;
    wherein said method further comprises reporting that the candidate parity signal was found to have the functionality of the parity signal.

2. The method of claim 1, wherein said obtaining the candidate parity signal comprises:
    performing a simulation of the circuit design;
    for each signal in the circuit design, flipping a value of the signal; and
    identifying an effected signal whose value is flipped in response to flipping the value of the signal, whereby the effected signal is the candidate signal and the signal whose value is flipped is comprised by the corresponding candidate set of support signals.

3. The method of claim 1, wherein said verifying comprises utilizing a Boolean Satisfiability problem (SAT) Solver.

4. The method of claim 3, wherein said verifying comprises:
    constructing a Conjunctive Normal Form formula (CNF), the CNF comprising:
        a logic circuit and a replicated logic circuit, wherein the logic circuit is a portion of the circuit design defining a value of the candidate parity signal based on the corresponding set of candidate support signals;
        the logic circuit having the corresponding candidate set of support signals as inputs to the logic circuit,
        the replicated logic circuit having, as inputs, values of the corresponding candidate set of support signals, each such value potentially flipped based on a value of an auxiliary signal,
        wherein the auxiliary signals are constrained using cardinality constraint logic to ensure that exactly one auxiliary signal is operable to flip exactly one of support signal,
        wherein values of the candidate parity signal in the logic circuit and in the replicated logic circuit are compared; and
        wherein the CNF is satisfiable if and only if the compared values are different.

5. The method of claim 4, wherein said verifying comprises: attempting to solve the CNF using the SAT solver, and in response to a determination that the CNF is unsatisfiable, indicating that the candidate parity signal is the parity signal and that the corresponding candidate set of support signals are the set of support signals.

6. The method of claim 5, wherein in response to a determination by the SAT solver that the CNF is satisfiable by a satisfying assignment:
  determining, based on the satisfying assignment, a candidate support signal of the candidate set of support signals for which a flipped value does not induce a flipped value of the candidate parity signal;
  removing the candidate support signal from the candidate set of support signals;
  reconstructing the CNF based on the updated candidate set of support signals; and
  attempting to solve the reconstructed CNF.

7. The method of claim 1, further comprising:
  identifying a parity-based error checker based on the parity signal;
  extracting checker information of the parity-based error checker, wherein the checker information comprises a protected state storage device which is protected by the parity-based error checker; and
  wherein said reporting comprises reporting to a user the existence of the parity-based error checker the checker information.

8. The method of claim 7, wherein the checker information further comprises checker gating conditions and type of parity protected.

9. The method of claim 1, further comprising: utilizing the reported identified parity signal for verification of the circuit design.

10. The method of claim 9, wherein the verification of the circuit design comprises at least one of the following:
  performing manual logic review of the circuit design;
  performing formal verification of the functionality of a parity-based error checker which is based on the parity signal; and
  automatically verifying that the circuit design adheres to a requirement of a corresponding circuit specification.

11. A computerized apparatus having a processor, the processor being adapted to perform the steps of:
  analyzing a circuit design to find a parity signal out of a plurality of signals defined by the circuit design, wherein a value of the parity signal is defined as a parity function of based on values of a set of support signals, wherein finding the parity signal comprises:
    obtaining a candidate parity signal and a corresponding set of candidate support signals; and
    verifying that the circuit design is configured to induce a bit flip on a value of the candidate parity signal in response to a bit flip in any single signal that is comprised by a subset of the set of candidate support signals, whereby the candidate signal is verified to be a parity signal with respect to the subset of the set of support signals;
  wherein said processor further adapted to report that the candidate parity signal was found to have the functionality of the parity signal.

12. The computerized apparatus of claim 11, wherein obtaining the candidate parity signal comprises:
  performing a simulation of the circuit design;
  for each signal in the circuit design, flipping a value of the signal; and
  identifying an effected signal whose value is flipped in response to flipping the value of the signal, whereby the effected signal is the candidate signal and the signal whose value is flipped is comprised by the corresponding candidate set of support signals.

13. The computerized apparatus of claim 11, wherein the verifying comprises utilizing a Boolean Satisfiability problem (SAT) Solver.

14. The computerized apparatus of claim 13, wherein verifying comprises:
  constructing a Conjunctive Normal Form formula (CNF), the CNF comprising:
    a logic circuit and a replicated logic circuit, wherein the logic circuit is a portion of the circuit design defining a value of the candidate parity signal based on the corresponding set of candidate support signals;
    the logic circuit having the corresponding candidate set of support signals as inputs to the logic circuit,
    the replicated logic circuit having, as inputs, values of the corresponding candidate set of support signals, each such value potentially flipped based on a value of an auxiliary signal,
    wherein the auxiliary signals are constrained using cardinality constraint logic to ensure that exactly one auxiliary signal is operable to flip exactly one of support signal,
    wherein values of the candidate parity signal in the logic circuit and in the replicated logic circuit are compared; and
    wherein the CNF is satisfiable if and only if the compared values are different.

15. The computerized apparatus of claim 14, wherein verifying comprises: attempting to solve the CNF using the SAT solver, and in response to a determination that the CNF is unsatisfiable, indicating that the candidate parity signal is the parity signal and that the corresponding candidate set of support signals are the set of support signals.

16. The computerized apparatus of claim 15, wherein in response to a determination by the SAT solver that the CNF is satisfiable by a satisfying assignment, the processor is adapted to perform:
  determining, based on the satisfying assignment, a candidate support signal of the candidate set of support signals for which a flipped value does not induce a flipped value of the candidate parity signal;
  removing the candidate support signal from the candidate set of support signals;
  reconstructing the CNF based on the updated candidate set of support signals; and
  attempting to solve the reconstructed CNF.

17. The computerized apparatus of claim 11, wherein said processor being further adapted to perform:
  identifying a parity-based error checker based on the parity signal;
  extracting checker information of the parity-based error checker, wherein the checker information comprises a protected state storage device which is protected by the parity-based error checker; and
  wherein said reporting comprises reporting to a user the existence of the parity-based error checker the checker information.

18. The computerized apparatus of claim 17, wherein the checker information further comprises checker gating conditions and type of parity protected.

19. The computerized apparatus of claim 11, wherein said processor being further adapted to perform: utilizing the reported identified parity signal for verification of the circuit design.

20. A computer program product comprising:
  a non-transitory computer readable medium retaining program instructions, which when read by a processor, cause the processor to performs the steps of:

analyzing a circuit design to find a parity signal out of a plurality of signals defined by the circuit design, wherein a value of the parity signal is defined as a parity function based on values of a set of support signals, wherein finding the parity signal comprises:
  obtaining a candidate parity signal and a corresponding set of candidate support signals; and
  verifying that the circuit design is configured to induce a bit flip on a value of the candidate parity signal in response to a bit flip in any single signal that is comprised by a subset of the set of candidate support signals, whereby the candidate signal is verified to be a parity signal with respect to the subset of the set of support signals;
wherein said program instruction, when read by the processor, further cause the processor to report that the candidate parity signal was found to have the functionality of the parity signal.

* * * * *